United States Patent [19]
Wavish

[11] Patent Number: 5,768,161
[45] Date of Patent: Jun. 16, 1998

[54] DATA PROCESSING APPARATUS

[75] Inventor: Peter R. Wavish, East Grinstead, England

[73] Assignee: U.S. Philips Corporation, New York, N.Y.

[21] Appl. No.: 778,708

[22] Filed: Jan. 3, 1997

Related U.S. Application Data

[63] Continuation of Ser. No. 418,995, Apr. 6, 1995, abandoned.

[30] Foreign Application Priority Data

Apr. 7, 1994 [GB] United Kingdom .................. 9406931

[51] Int. Cl.$^6$ .......................... G06F 9/455; G06F 17/50; G05B 19/04
[52] U.S. Cl. .......................... 364/578; 364/489; 395/51; 395/500; 395/920; 395/921
[58] Field of Search .............................. 364/578, 488, 364/489, 490, 491, DIG. 1, DIG. 2, 580; 395/51, 61, 183.09, 500, 908, 920, 921

[56] References Cited

U.S. PATENT DOCUMENTS

| | | | |
|---|---|---|---|
| 4,365,297 | 12/1982 | Grisham, Jr. | 364/200 |
| 4,845,633 | 7/1989 | Furtek | 364/490 |
| 4,926,308 | 5/1990 | Giles et al. | 364/147 |
| 5,150,308 | 9/1992 | Hooper et al. | 364/489 |
| 5,175,696 | 12/1992 | Hooper et al. | 364/489 |
| 5,197,116 | 3/1993 | Katoh et al. | 393/51 |
| 5,204,939 | 4/1993 | Yamazaki et al. | 395/51 |
| 5,313,560 | 5/1994 | Maruoka et al. | 395/61 |
| 5,392,227 | 2/1995 | Hiserote | 364/578 |
| 5,418,887 | 5/1995 | Connah et al. | 395/51 |
| 5,469,367 | 11/1995 | Puri et al. | 364/489 |
| 5,477,474 | 12/1995 | Southgate et al. | 364/578 |
| 5,493,505 | 2/1996 | Banerjee et al. | 364/488 |

FOREIGN PATENT DOCUMENTS

| | | | |
|---|---|---|---|
| 0331060 | 9/1989 | European Pat. Off. | G05B 19/04 |
| 0397259 | 11/1990 | European Pat. Off. | G05B 19/04 |
| 0424056 | 4/1991 | European Pat. Off. | G05B 19/05 |
| 0450371 | 10/1991 | European Pat. Off. | G06F 9/44 |
| 0592076A2 | 4/1994 | European Pat. Off. | |

OTHER PUBLICATIONS

Wavish, "Real Time ABLE", PRL Redhill Review, 1990, pp. 20-23.

Graham et al., "Simulating and Implementing Agents and Multiple Agent Systems", Proc. European Simulation Multiconference 1991, pp. 226-231.

Rosenschein et al., "The Synthesis of Digital Machines With Provable Epistemic Properties", publ. in *Theoretical Aspect of Reasoning About Knowledge*, 1986, pp. 83-98.

Chapman et al., "Abstract Reasoning as Emergent From Concrete Activity", pp. 411-424.

Grove et al., "SPL/7 Software System", IBM Technical Disclosure Bulletin, vol. 20, No. 1, Jun. 1977, pp. 68-70.

(List continued on next page.)

*Primary Examiner*—Kevin J. Teska
*Assistant Examiner*—Tyrone V. Walker
*Attorney, Agent, or Firm*—Debra K. Stephens

[57] ABSTRACT

A data processing apparatus includes apparatus for modelling asynchronous logic circuits as at least two of circuit elements the functions of which are governed by a set of rules each defining a response to a given condition. For elements functioning as registers (x,b) a "copy" rule may be applied to at least one of them (x) with the associated response to the copy rule being the change of the output state of that register element (218,220) in response to a change of output state of a further register element (b) identified by the copy rule. A further "identify" rule (200-226) may be applied to pairs of the register elements (x,b), according to which rule copy rules are applied to each element of the pair (216-222) in respect of changes of output state of the other. The apparatus may be arranged to model a number of asynchronous logic circuits in a working memory area with interconnections between such circuits being established by use of the identify rule.

10 Claims, 7 Drawing Sheets

OTHER PUBLICATIONS

Brooks, "A Robust Layered Control System For A Mobile Robot", IEEE Journal of Robotics and Automation, vol. RA-2, No. 1, Mar. 1986, pp. 14–23.

Kano, Abstract—"Decomposition of Call State Diagram and its Applications", Trans. Inst. Electron & Commun. Eng. Jpn. Sect. E (Japan), vol. E61, No. 11, pp. 991–992, Nov. 1978.

Kawashima et al., Abstract—"Call Processing Programming Structure Based on Sequential Machine Concept", Trans. Inst. Electron & Commun. Eng. Jpn. Sect. E (Japan), vol. E61, No. 8, pp. 658, Aug. 1978.

Deguchi et al., Abstract—"Probabalistic CESS: Analysis of Timine Error Probability in Asynchronous Logic Circuits", Proc. 28th ACM/IEEE Design Automat. Conf., ACM, pp. 650–655, 1991.

Koelmans et al., Abstract—"Asynchronous Extension to the STRICT High Level Design", Proc. 8th International Custom Microelectronics Conf., Prodex, pp. 23/1–6, 1988.

Plaskin, Abstract—"A Model For Identification of Competions in Industrial Automation Equipment", Izv Vyssh Zaved Elektromekh (USSR), No. 6, pp. 63–67, 1988.

Chebotarev, Abstract—"Hazard Analysis in Asynchronous Logic Circuits", A N chebotarev Kibernetika (USSR), vol. 23, No. 5, pp. 26–32, Sep.–Oct. 1987.

Lister et al., Abstract—"Data–Flow Based Design of Self–Timed Systems", IEE Colloquium on VLSI Design and Methodologies (Digest No. 41), pp. 4/1–4, 1985.

Chebotarev, Abstract—"Analysis of Asynchronous Logic Circuits", A N Chebotarev, Kibernetika (USSR), vol. 16, No. 6, pp. 14–23, Nov.–Dec. 1980.

Nikolenko, Abstract—"Transformations of Asynchronous Logic Circuits", V. N. Nikolenko, Kibernetika (USSR), vol. 14, No. 5, pp. 6–8, Sep.–Oct. 1978.

| EN | S | Q | INT. | SA |
|----|---|---|------|-----|
| 10 | 1 | 0 | N/A | 100 |
| 18 | 0 | 1 | N/A | 200 |
| 24 | 0 | 0 | 1 | 300 |
| 32 | 0 | 0 | N/A | 400 |
| 52 | 0 | 0 | N/A | 500 |
| 38 | 1 | 0 | N/A | 600 |
| 44 | 0 | 0 | N/A | 700 |

| EN | S | Q | INT | SA |
|----|---|---|-----|-----|
| 10 | 1 | 0 | N/A | 100 |
| 18 | 0 | 1 | N/A | 150 |
| 86 | 1 | 0 | N/A | 200 |
| 80 | 0 | 0 | 1   | 250 |
| 92 | 0 | 0 | N/A | 300 |
| 96 | 1 | 0 | N/A | 350 |
| 52 | 0 | 0 | 0   | 400 |
| 24 | 0 | 0 | 1   | 450 |
| 88 | 1 | 0 | N/A | 500 |
| 82 | 0 | 0 | 1   | 550 |
| 26 | 0 | 0 | 1   | 600 |
| 32 | 0 | 0 | N/A | 650 |
| 90 | 1 | 0 | N/A | 700 |
| 84 | 0 | 0 | 1   | 750 |
| 94 | 0 | 0 | N/A | 800 |
| 38 | 1 | 0 | N/A | 850 |
| 44 | 0 | 0 | 0   | 900 |

FIG. 4

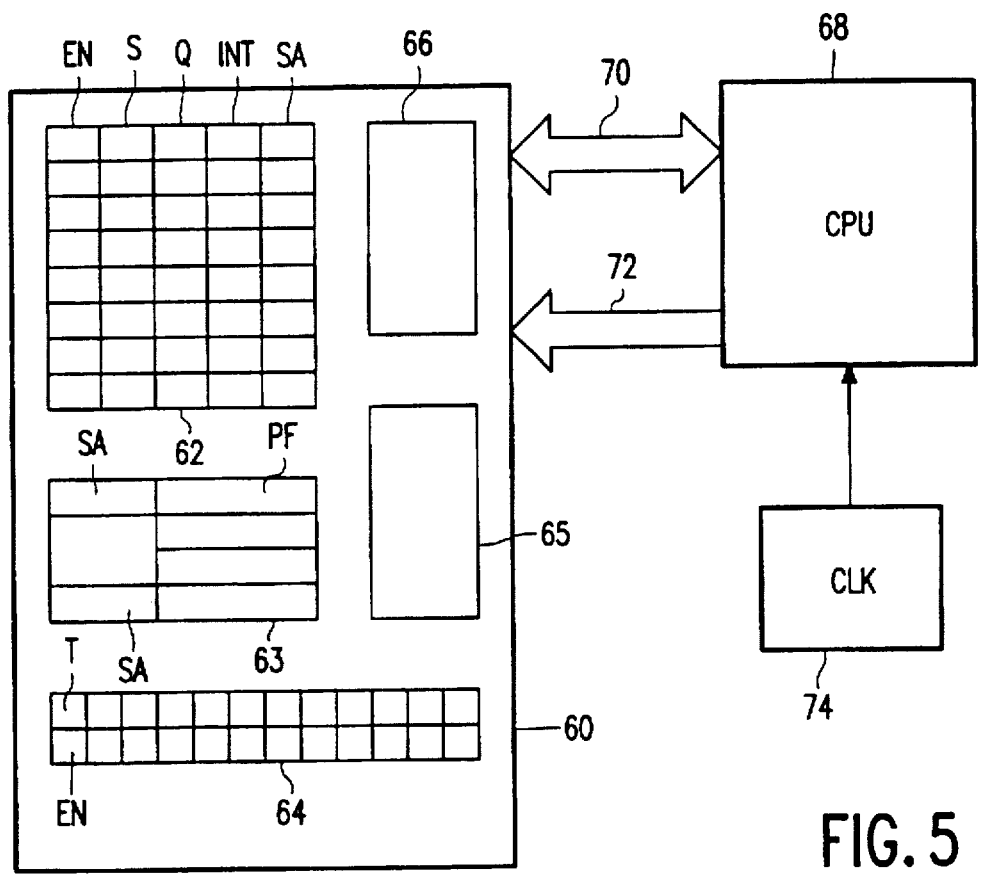
FIG. 5
FIG. 6
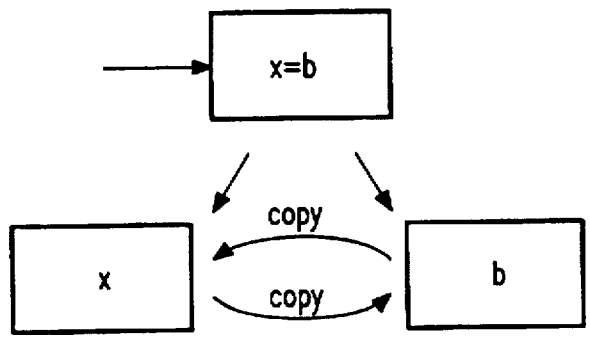
FIG. 7

DATA PROCESSING APPARATUS

This is a file wrapper continuation of application Ser. No. 08/418,995, filed Apr. 6, 1995, now abandoned.

BACKGROUND OF THE INVENTION

The present invention relates to a data processing apparatus for the modelling of logic circuitry for, inter alia, behavioural simulation and having particular, but not exclusive, application to execution of compiled production rule systems.

Behavioural simulation or modelling at its most basic level includes rule-based modelling of simple devices or scenarios in which a given input or stimulus produces a consistent output. More complex simulations, whilst taking account of an increasing number of factors (for example the order or period within which inputs are received) may still be considered in terms of logic circuits.

An example of behavioural modelling is in an automated tuition system in which a tutee is required to answer questions following periods of instruction, with the questions becoming harder as the level of instruction increases. By taking account of factors such as how quickly questions are answered and the ratio of right answers to wrong, the system can to an extent tailor itself to the tutee by, for example, repetition of current or lower level instruction and questions in response to a poor answering performance and rapid increase in instruction level in response to consistently good answering performance.

An example of simulation of a logic system as a plurality of design units connected together in a network and having a compilation mechanism controlled by a steering file (a set of control statements) is described in European Patent Application EP-A-0 592 076 of International Computers Limited. In the ICL system, each statement specifies whether a design unit is to be expanded as a sub-network and/or represented in terms of its behaviour specification. Where both sub-network and behavioural simulation options are selected, a CHECK command is provided for comparing the respective outputs to ensure correctness of the simulation, such as to reduce the size and run-time of whole-system modelling by use of the existing simulations for the design units. A drawback of the system, however, is that it is directed toward generation of fixed logic circuits and as such it is restricted in terms of operational flexibility.

The compilation of a production rule system (Real Time ABLE (RTA) in the example given) into a representation in the style of a logic circuit is described in Proceedings of the European Simulation Multiconference 1991 at pages 226–231. ABLE stands for Agent Behaviour Language and is a highly concurrent production rule language for simulating agents (entities operating in accordance with rule-based behaviours) and multiple agent systems. ABLE provides for tighter integration of time with the production rule system. The language may conveniently be compiled into a representation which includes a number of interconnected elements such as AND elements, OR elements, delay elements and so on. RTA uses a propagation technique as opposed to a search strategy to obtain a fast production rule system.

OBJECTS AND SUMMARY OF THE INVENTION

The execution of a compiled production rule system as in asynchronous logic circuit representation has, however, been found to be rather restrictive in terms of the functions that may be performed and this also limits the versatility of the production system.

It is therefore an object of the present invention to reduce this restriction.

In accordance with the present invention there is provided a data processing apparatus comprising means for modelling a first asynchronous logic circuit as a plurality of circuit elements the functions of which are governed by a set of rules each defining a response to a given condition and the apparatus comprising means for responding to any said condition being satisfied by generating the associated response, wherein two or more of the elements function as registers each having two or more output states, the apparatus further comprising means for generating a further rule (a "copy" rule) applied to at least one of the register elements, the associated response to the copy rule being the change of the output state of the said at least one register element in response to a change of output state of a further register element identified by the copy rule. By providing effectively for dynamic alteration of the representation of the compiled production rule system during execution a considerably more flexible data processing apparatus may be provided for, inter alia, executing production rule systems.

In order to avoid conflicts, the change of state of an element due to a copy rule may not be effected where an earlier change of state instruction (other than due to the copy rule) exists but has still to be implemented. Alternatively, where an earlier change of state instruction exists but has yet to be implemented when a change of state instruction arising from a copy rule is generated, the instruction due to the copy rule may be implemented and the earlier instruction cancelled.

Means may suitably be provided for applying a further rule (an "identify" rule) to a pair of the register elements, according to which rule copy rules are applied to each element of the pair in respect of changes of output state of the other. In effect, such an identify rule would cause a pair of register elements to follow the state of the pair member which has most recently changed. On initial application of an identify rule, the pair of register elements are preferably nominated as first and second elements with the output state of the second element being set to change to correspond to that of the first element. The change may occur immediately, but would be more likely to be added to an event queue for the second element.

Tree structures of such identify rules may be formed, in which respective identify rules may be applied to pairs formed by a single first element and respective ones of a plurality of second elements. To prevent problems which might arise from an element attempting to follow changes in the output state of two or more further elements, the application of a further identify rule to an element nominated as a second element in a first identify rule preferably cancels the said first identify rule where the said second element is so nominated in the further identify rule. In other words, each element may act as first element to any number of second elements but as second element to only a single first element.

The means for applying an identify rule may comprise a further ("control") register element, wherein when the output state of the control register element has a first value the identify rule is applied, and when it has a second value, the copy rules between the two register elements are cancelled.

The apparatus may comprise means for modelling a plurality of further asynchronous logic circuits, and may include a working memory area in which the first and further circuits are modelled, and data storage means from which data defining yet further asynchronous logic circuits may be called into the working memory area. A data processing apparatus having these features would accordingly be operable to execute large production rule systems in a relatively modest working memory space. Provided that only a portion of the complete production rule system requires to be executed at any one time, the system may be arranged as a number of modules (circuits) the data for which may be loaded to working memory, executed and then replaced by subsequent circuits.

Apparatus embodying the present invention may provide for dynamic linking of the elements by applying a copy rule to the two elements to be linked together (an identify rule). The copy instruction effects the change of output state of a "target" device in accordance with a change of output state of the "host" device to which the propagate function is attached, and in the case of an identify instruction each of a pair of elements acts as target to the others host.

An apparatus in accordance with the invention may be realised by dedicated hardware or by a suitably programmed microprocessor.

The propagate function may include a list of element identities, being the elements potentially affected by a change of state of the original element. A storage means may conveniently be arranged as an event queue, that is a sequential list of elements whose state is to change at a listed time in the future.

Future changes of element states, or events, are thus queued to occur later and this ensures that all of the events queued to occur in the present time period are carried out before any of the events which are consequential upon them. Future events may be specifically queued to occur later than this as would be required, for example, by a delay element.

In addition to the register elements mentioned above, other conventional logic circuit functions such as AND, OR, delay and so on as determined by the application, may be provided as further elements. One such element function is AND_THEN which provides for the element output to be turned on if and only if the outputs of two or more other elements are turned on in a specified order.

It is also possible to provide one or more call functions in the propagation function of an element. This is particularly useful to execute a piece of software code within the data processing apparatus or on an associated processor and then return to the determination of the effects of the state change on the present or host element.

BRIEF DESCRIPTION OF THE DRAWINGS

The present invention will now be described, by way of example, with reference to the accompanying drawings, in which:

FIG. 4 is an expansion of the table of FIG. 2 for the representation of FIG. 3;

FIG. 5 is a block schematic diagram of a data processing apparatus in accordance with the present invention;

FIG. 6 is a diagram of a queued event storage means of the apparatus of FIG. 5;

FIG. 7 shows an identify element;

DESCRIPTION OF THE PREFERRED EMBODIMENTS

Figures 1, 2:
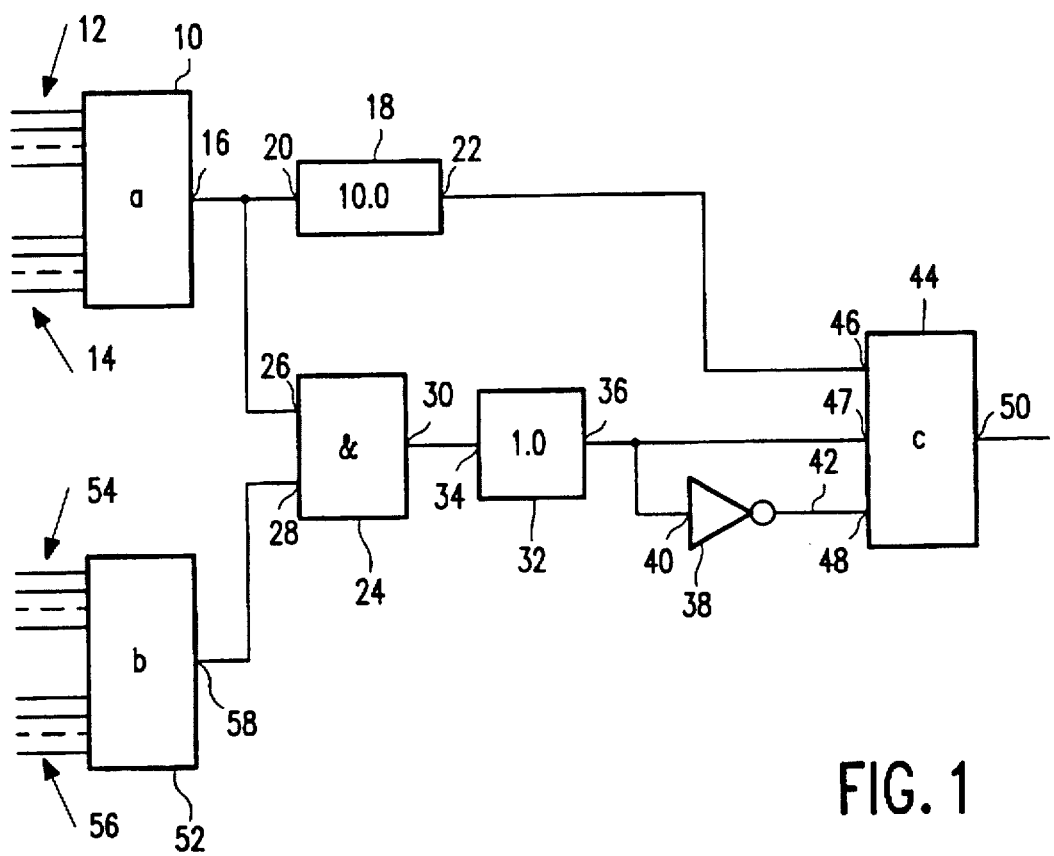
FIG. 1 is a logic representation of a simple production rule system.
FIG. 2 is a table illustrating a representation of the system of FIG. 1.

FIG. 1 shows a basic form of a logic representation of an asynchronous logic circuit compiled from a simple RTA system. A register 10 has a plurality of independent start or support inputs 12, a plurality of independent stop or reject inputs 14 (the difference between start and support and between stop and reject is discussed below) and an output 16. The output 16 is connected to the input 20 of a delay element 18 and to a first input 26 of an AND element 24. The delay element 18 sets a delay of 10.0 seconds (although it will be readily appreciated that other units of time may be used) such that the output of the element 18 will be turned on 10 seconds after the input is turned on: the output will however be turned off at the instant the input is turned off. The output 22 of the delay element 18 is connected to one of a plurality of start or support inputs 46,47 of a register 44. The register 44 also has a stop or reject input 48 and an output 50. A further register 52 has a plurality of start or support inputs 54, a plurality of stop or reject inputs 56 and an output 58. The output 58 is connected to a second input 28 of the AND element 24. The AND element 24 has an output 30 connected to the input 34 of a further delay element 32 having a delay of 1.0 second. The output 36 of the delay element 32 is connected to another of the plurality of start inputs 46 of the register 44 and to the input 40 of an inverter 38. The inverter 38 has an output 42 connected to the stop input 48 of the register 44. The status of the registers 10,52 and 44 are represented by the letters a, b and c respectively.

The simple system of FIG. 1 provides the following RTA program rules:

$$a/10.0 > c \qquad (1)$$

$$(a \& b)/1.0 > c \qquad (2)$$

(1) is a type of rule called a licence and has the effect of setting the status c of register 44 if the status a of register 10 has been set continuously for 10 seconds. In FIG. 1 this licence is effected by the delay 18 connected between the output 16 of the register 10 and one of the start inputs 46 of the register 44.

(2) is a type of rule called a schema which is similar to a licence but which provides the additional effect that as soon as the conditions which satisfied the schema no longer exist then the consequence of the schema is retracted. In this example, the status c of the register 44 is set if the outputs a and b of register 10 and 52 are both set continuously for 1.0 second. This effect is provided by the output 30 of the AND element 24 being coupled via the delay element 32 to another of the start or support inputs 47 of the register 44. However, the status c of the register 44 must also be reset if either the status a of register 10 or the status b of the register 52 is reset. This effect is achieved by the inverter 38 connected between the output 36 of the AND element 32 and the stop or reject input 48 of the register 44.

The elements of the representation can be regarded as edge-triggered by virtue of the propagating or forward-chaining nature of the apparatus. The inputs to register elements 10,52 and the output of the register element 44 are generally connected to further sections of a larger asynchronous logic representation.

Such a logic representation may be stored in an apparatus in accordance with the present invention in the form of a table as shown in FIG. 2. Each of the register elements 10,52,44, delay elements 18,32 and logic function elements 24,38 shown in FIG. 1 has a row in the table. Each row in the table identifies the element number EN (for the sake of clarity, the reference numerals used to identify elements in FIG. 1 are used here), a status flag S of the device, a queued status flag Q of the device (as will be explained), the internal status INT, and a propagate function start address SA. When the status of the device to which the row of the table relates (the originating or host device) changes, a propagate function is executed to effect any appropriate changes to all of the elements which may be affected by such a change. These propagate functions are conveniently arranged at certain memory locations or start addresses SA.

The propagate functions of the elements of FIG. 1 might be:

| SA | PF |
|---|---|
| 100 | Delay 18,10.0 |
|  | AND 24 |
| 200 | Start_behaviour 44 |
| 300 | Delay 32,1.0 |
| 400 | Start_behaviour 44 |
|  | NOT 38 |
| 500 | AND 24 |
| 600 | Stop_behaviour 44 |

Only the status of those elements in this list need to be investigated in response to a change of the status of the originating device. Changing the status of elements by propagation in such a manner rather than by searching for all of the elements affected by a change of status allows the apparatus to operate efficiently.

Figure 3:
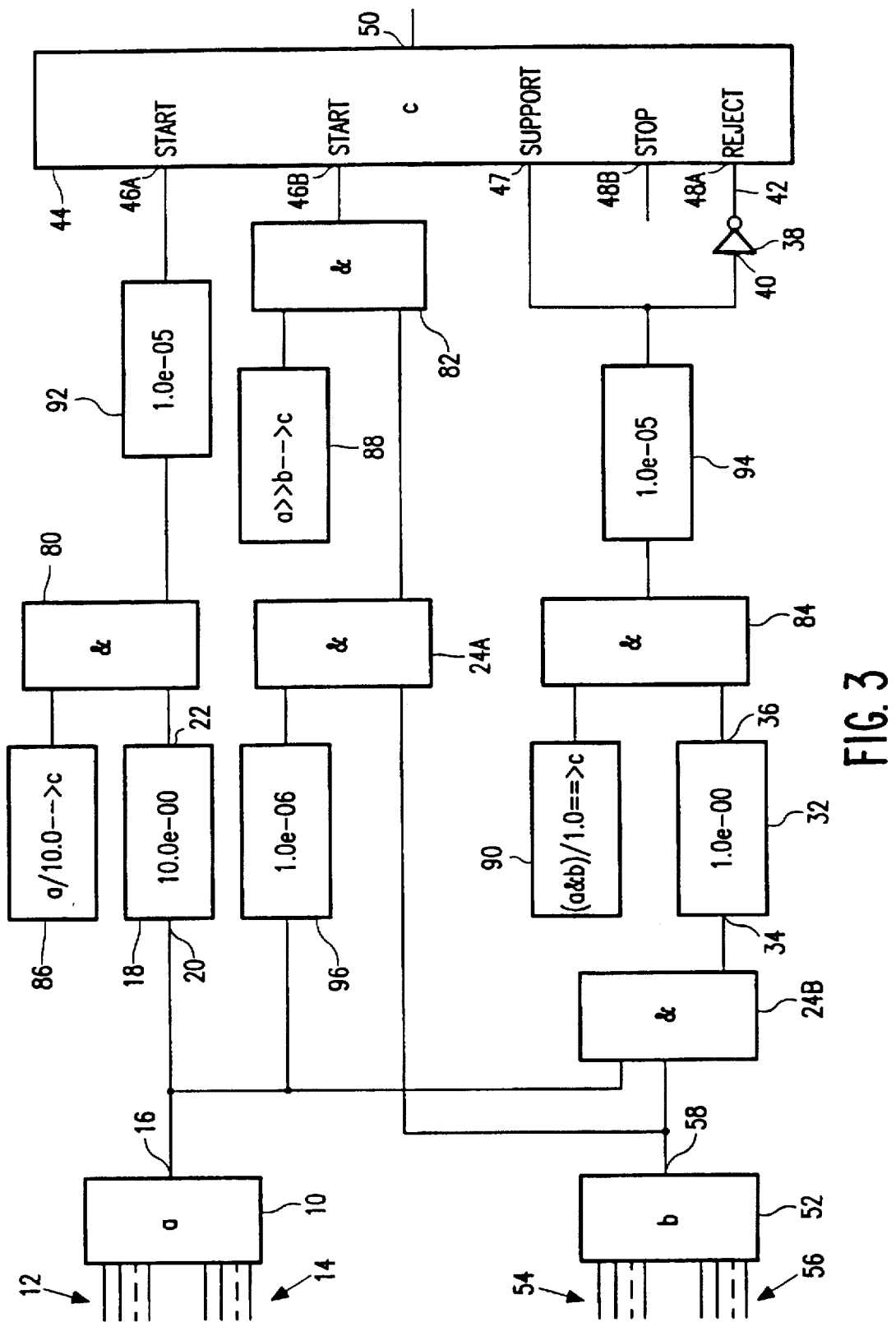
FIG. 3 is a more detailed representation of the production rule system of FIG. 1.

A more detailed representation of the system of FIG. 1 is shown in FIG. 3, with correspondingly more detailed storage table shown in FIG. 4. Those elements performing the same as in FIG. 1 are correspondingly numbered and will not be further described; the decreased spacing/reallocation of start address SA values in FIG. 4 reflects only the increased number of elements considered, and no inference should be made as to non-correspondence between SA values for a given element in FIGS. 2 and 4.

The behaviour of the system as viewed from the inputs of register 44 may be specified as follows:

```
BEHAVIOUR c (YES)
START:
    DELAY 1.0e-05 seconds (NO)
    AND (NO)
        LICENCE (a)/10.0—>c (YES)
        DELAY 10.0 seconds (NO)
            BEHAVIOUR a (YES)
    DELAY 1.0e-05 seconds (NO)
    AND (NO)
        LICENCE a>>b—>c (YES)
        AND THEN (NO)
            DELAY 1.0e-06 seconds (NO)
                BEHAVIOUR a (YES)
                BEHAVIOUR b (YES)
```

```
-continued
STOP:
    TERMINAL (NO)
SUPPORT:
    DELAY 1.0e-05 seconds (NO)
    AND (NO)
        SCHEMA (a&b)/1.0=>c (YES)
        DELAY 1.0 seconds (NO)
            AND (YES)
                BEHAVIOUR a (YES)
                BEHAVIOUR b (YES)
REJECT:
    NOT (YES)
        DELAY 1.0e-05 seconds (NO)
        AND (NO)
            SCHEMA (a&b)/1.0=>c (YES)
            DELAY 1.0 seconds (NO)
                AND (YES)
                    BEHAVIOUR a (YES)
                    BEHAVIOUR b (YES)
```

As can be seen, the differentiation between inputs as start or support (and also stop or reject) depends on whether they receive the result of a schema. Inputs 46A and 46B are start inputs as they receive the result of a licence whilst support input 47 receives the result of the schema. Additional elements represented in FIG. 3 are AND elements 80, 82 and 84 which are required by RTA for combining the rule functions 86, 88 and 90 with the specified behaviours. These functions are assumed to exist and accordingly have a status S=1 (FIG. 4). Additional small delays (typically 10 microseconds) 92 and 94 are provided to allow states to settle before being read. The AND element 24 of FIG. 1 is shown functioning as both an AND gate 24B and an AND_THEN element 24A as will be described in greater detail hereinafter, with additional delay 96 ensuring the correct order of receipt from register 10 and 52. In the table of FIG. 4, the small delays 92,94 and 96 are assumed already to have propagated through and hence these elements are shown with a queued status of Q=0.

FIG. 5 is a block schematic diagram of a data processing apparatus embodying the invention. A random access memory (RAM) 60 comprises a storage means 62 containing the list of element numbers EN, state S, queued status Q and start addresses SA as described with reference to FIGS. 2 and 4. The propagate functions PF starting at the start addresses are stored in another storage means 63. The RAM 60 also comprises the further storage means 64 for storing future element state changes, and a program store 66. The program store and the propagate functions could, if desired, be stored in another memory device, for example a read only memory. The RAM 60 is connected to a central processing unit (CPU) 68 by a data bus 70 and an address bus 72 in known manner. Also in known manner, a clock (CLK) 74 is connected to the CPU 68.

The further storage means 64 may be arranged as shown in FIG. 6 as a two row table containing a plurality of time periods T and element numbers EN. Any number of element numbers EN can be stored to correspond to a particular time period T and the states of these elements will all be changed during that time period. For efficient use of memory, however, the table may be formed as a list of only those time periods for which element state changes are queued, with a facility for insertion of time periods not previously listed.

Generally, all element state changes except those corresponding to delay elements will be executed in the current time period although other element state changes can be also delayed if desired. Those element state changes which are to occur without a time delay may be placed in an event stack 65 (FIG. 5) for execution in the future (i.e. later in the current time period), but before moving to the next time period for which an event is specified.

Figure 8:
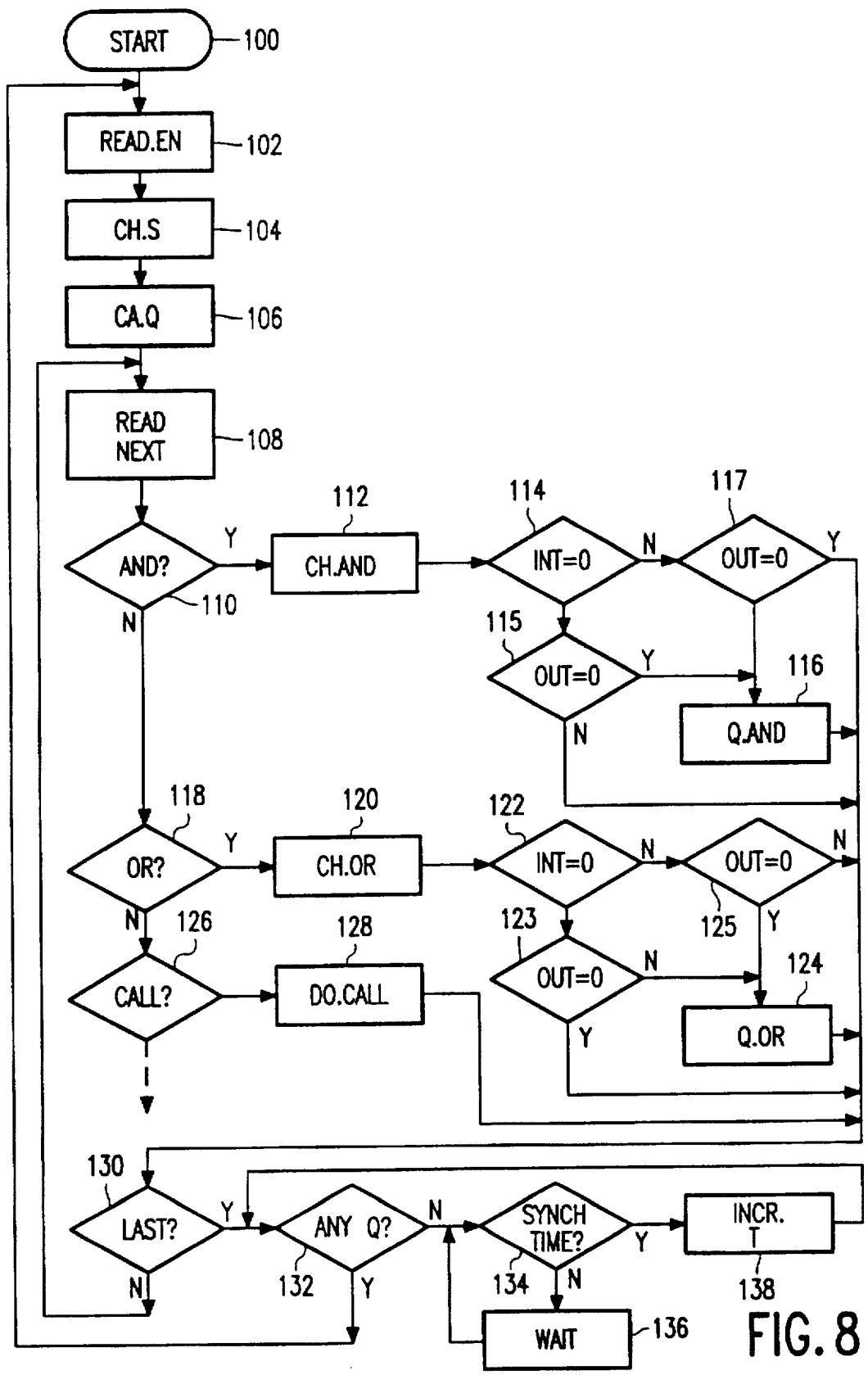
FIG. 8 is a flow chart illustrating the steps carried out by the processor of FIG. 5.

The program store 66 contains the instructions which are performed by the CPU 68 to carry out the changes of device state stored in the memory 62 and to determine the device state changes consequent upon them. FIG. 8 shows a flow chart for the operation of the CPU 68 in accordance with instructions stored in the program store 66. The numbered steps in the flow chart have the following functions.

100—START

102—read element number EN of host element from memory 64

104—change external state S of host element

106—cancel queued status Q of host element

108—read next item from propagate function of host element

110—Is the item an AND function?

112—alter internal state of specified AND element, decrement if host element state change is from off to on, and increment if from on to off 114—Is internal state of the AND device 0?

115—Is output state of the AND device 0?

116—queue a change of output state of the AND element and set queued flag of AND element 117—Is output state of the AND device 0?

118—Is the item on OR function?

120—alter internal state of specified OR element, increment if host element state change is from off to on, and vice versa 122—Is internal state of OR element 0?

123—Is output state of the OR device 0?

124—queue a change of output state of the OR element and set queued flag of OR element 125—Is output state of the OR device 0?

126—Is the item a call function?

128—Call the designated function and return

130—Is the present item the last one in the propagation function of the host element?

132—Are there any further elements listed in the event queue at the present time (or in the event stack, if present)

134—has sufficient time elapsed during present time period for system to be synchronised with real time 136—wait a short time 138—Increment value of T The routine of FIG. 8 operates as follows. An item is read from the memory 64 at step 102 and the relevant element output state S and its queued state Q are updated at steps 104,106. The next item in the propagate function for the element is then read from the relevant PF portion of the memory 63 at step 108. If the item is an AND function (step 110) the internal state of the specified AND element is altered (step 112). The internal state of an AND element is equal to the number of inputs to that element which are off or logical zero. Accordingly when the internal state of the element is zero, the AND function is satisfied and the output state should be on or logical one. If the change of state of the host element that was effected at step 104 was to turn the host element on (or a change from logical 0 to logical 1) then the internal state of an AND element in its propagation function is reduced by 1. Conversely if the change of state that was effected at step 104 was to turn the host element off (or a change from logical 1 to logical 0) then the internal state of an AND element specified in its propagation function is increased by 1. The crucial internal state changes for an AND element are from 0 to 1 and from 1 to 0 (tested for at steps 114, 115 and 117). If either of these changes occurs then the output state of the element should change accordingly. The change in output state is not effected immediately to avoid clashes within the apparatus but is queued (step 116) for future execution in the same time interval. The queued status Q of the element is turned on or set to logical 1 in the memory 62.

If the item read from the PF in memory 62 is an OR element (step 118) the internal state of the specified OR element is altered (step 120) accordingly. If the change of state of the host element at step 104 was to turn the host element on then the internal state of the OR element is increased by 1. Again the important internal state changes are from 0 to 1 and 1 to 0 (tested for at steps 122, 123 and 125) but the consequences for the output state of the device are reversed: the change in internal state from 0 to 1 makes the output state 1, and the change from 1 to 0 makes the output state 0. Again the actual change of state is placed in the queue (step 124) in memory 64 for execution in the next time period.

Concluding the flow chart of FIG. 8, step 130 checks whether the event just handled is the last in the propagate function of the host element: if not, the sequence reverts to step 108 where the next event is read. If at the end of a propagate function, the next stage (step 132) is to check whether there are any further elements queued for state change within the current time period T. If there are, the element number is read from memory at step 102: if not, a check (step 134) is made as to whether the time period is synchronised with real time, with a short wait loop (step 136) until this occurs. Finally, the time period T is incremented at step 138, either to the immediately following time period or to the next for which any events are queued as described previously with reference to FIG. 6.

Element propagate functions may further comprise the following instructions which may be placed in the PF memory and effectively added to the flow chart of FIG. 8 (as represented by the call function of steps 126 and 128). These are listed below in terms of their effect if the host element has turned on or off.

If the host element to which the propagate function is attached turns ON:

| | |
|---|---|
| start_behaviour | turns the specified element output on after 1 time unit |
| stop_behaviour | turns the specified element output off after 1 time unit |
| delay | turns the specified delay element output on after a specified number of time units |
| AND | decreases internal state of specified AND element and turns output state on if internal state = 0 |
| AND_THEN_left | enables the AND_THEN element by setting an internal state bit in that element |
| AND_THEN_right | turns the AND_THEN element on if it is enabled |
| NOT | turns the output of the NOT element (invertor) off. |
| finish | stops executing the current propagate function and starts executing the propagate function belonging to the next element listed in the present time period or event queue (when present) |
| copy | turns the specified register element output on and then jumps to the remainder of the propagate function |
| identify | creates a pair of copy instructions which are prefixed to the propagate functions of the two specified elements. Turns off the host element of |

-continued

| | |
|---|---|
| | any other identify instruction which shares the first specified device. |
| TLU | add the weight specified in the TLU instruction to the internal state of the specified TLU element. If internal state rises above/falls below threshold then turn output state on/off. |
| call_function | causes the specified software function to be executed by a conventional processor. |
| call-function-if-yes | causes the specified software function to be executed by a conventional processor. |
| call_function_if_no | no effect. |

If the host element to which the progagate function is attached turns

| | |
|---|---|
| start_behaviour | no effect |
| stop_behaviour | no effect |
| delay | turns the specified delay element output off immediately |
| AND_THEN_left | disables the specified AND_THEN element by clearing the internal state bit |
| AND_THEN_right | turns the AND_THEN element off |
| NOT | turns the output of the NOT element on |
| finish | stops executing the current propagate function and starts executing the propagate function belonging to the next element listed in the present time period or event queue (where present) |
| copy | turns the specified register element output off and then jumps to the remainder of the propagate function |
| identify | deletes the pair of copy instructions which were created when the host identify element turned on. |
| TLU | subtract the weight specified in the TLU instruction from the internal state of the specified TLU element. If internal state rises above/falls below threshold then turn output state on/off |
| call_function | causes the specified software function to be executed by a conventional processor |
| call_function_if_yes | no effect |
| call_function_if_no | causes the specified software function to be executed by a conventional processor. |

The copy, identify, TLU and the AND_THEN instructions will now be further explained. Copy forces the state of the specified element to be the same as the state of the host element whose state has just changed by adding the state change of the host element to the event queue of the specified element, typically for execution in the immediately following time period. Identify creates a pair of copy instructions provided at the head of the propagate functions of two elements. This allows an apparatus in accordance with the invention to exhibit a degree of dynamic adaptability by effectively connecting or linking together two register elements so that they behave as a single element. The two register elements can be disconnected or unlinked from each other by turning off the element or elements whose propagate function(s) included the copy or identify instruction(s). This makes these instructions especially useful where, for example, a large production system is to be executed in a limited physical memory space. Only some sections (circuits) of the total system actually need to be loaded into the working memory area of the data processing apparatus at any particular instant and the interconnections between registers of those circuits loaded at any particular instant and the interconnections with circuits loaded subsequently can be effected using the identify instruction.

An identify element (typically a further register element) is illustrated in FIG. 7. Its purpose is to link together the output states of two other elements to be equal to the output state of the one of the two elements which has changed state most recently. The identify element allows the compiled production rule system to be dynamically altered in use. In this example identify instructions would appear as:

Identify x,b where the two elements whose states are being linked are called x and b. The steps performed by the identify rule are shown in the flow chart of FIG. 9 where the steps have the following effects:

200—start

202—read first element (x), read second element (b)

204—does propagate function of second element (b) have an existing copy instruction?

206—is that copy instruction the first listed for b?

208—alter start address SA for second element (b) to indicate original propagate function for element (b) or next copy instruction listed for b 210—if the copy instruction is not the first listed for b, remove it and create a replacement link between the preceding and following copies or between the preceding copy and propagate function for b 212—is the copy instruction the first listed for the element to which b is currently linked by a copy (for example k) the first listed for k 214—if so, alter start address SA for k specified in the existing copy instruction to indicate original propagate function of that element (k) or next copy function listed for that element 216—if copy instruction is not the first listed for k, remove it and create replacement link 218—cancel identify linking k and b 220—generate copy routine at address a1 with argument of second element (b) and return address equal to start address SA for propagate function of first element (x)

222—generate copy routine at address a2 with argument of first element (x) and return address equal to start address SA for propagate function of second element (b)

224—alter start address SA for first element (x) to indicate address a1

226—alter start address SA for second element (b) to indicate address a2

228—turn output state of identify element on

230—Return

The identify instruction operates to generate a copy instruction at the very beginning of the propagate functions for the two elements (x,b) whose output states are being linked together. The copy instruction imposes the change of output state of the originating or host element upon the specified or target element by placing the change of state of the specified element in the event queue as described previously. The copy instruction will be described in more detail below. The identify instruction generates at 222 a copy routine for the first element (x) specified in the identify instruction at an address a1 with the arguments of the second element and the start address for the original propagate function of the first element (x). The start address SA of the propagate function for the first element is then altered at step 224 to be equal to the address a1. Thus when the first element (x) changes state and its propagate function is called, the copy routine will be executed and then process control will jump to the remainder of the first element's propagate function and continue as usual. The identify instruction also generates a corresponding copy function for the second element specified in the identify instruction at 220 and alters the start address SA for the propagate function of the second element at 226. The state of the identify behaviour is also set at 228 and the routine ends at 230.

Figure 9:
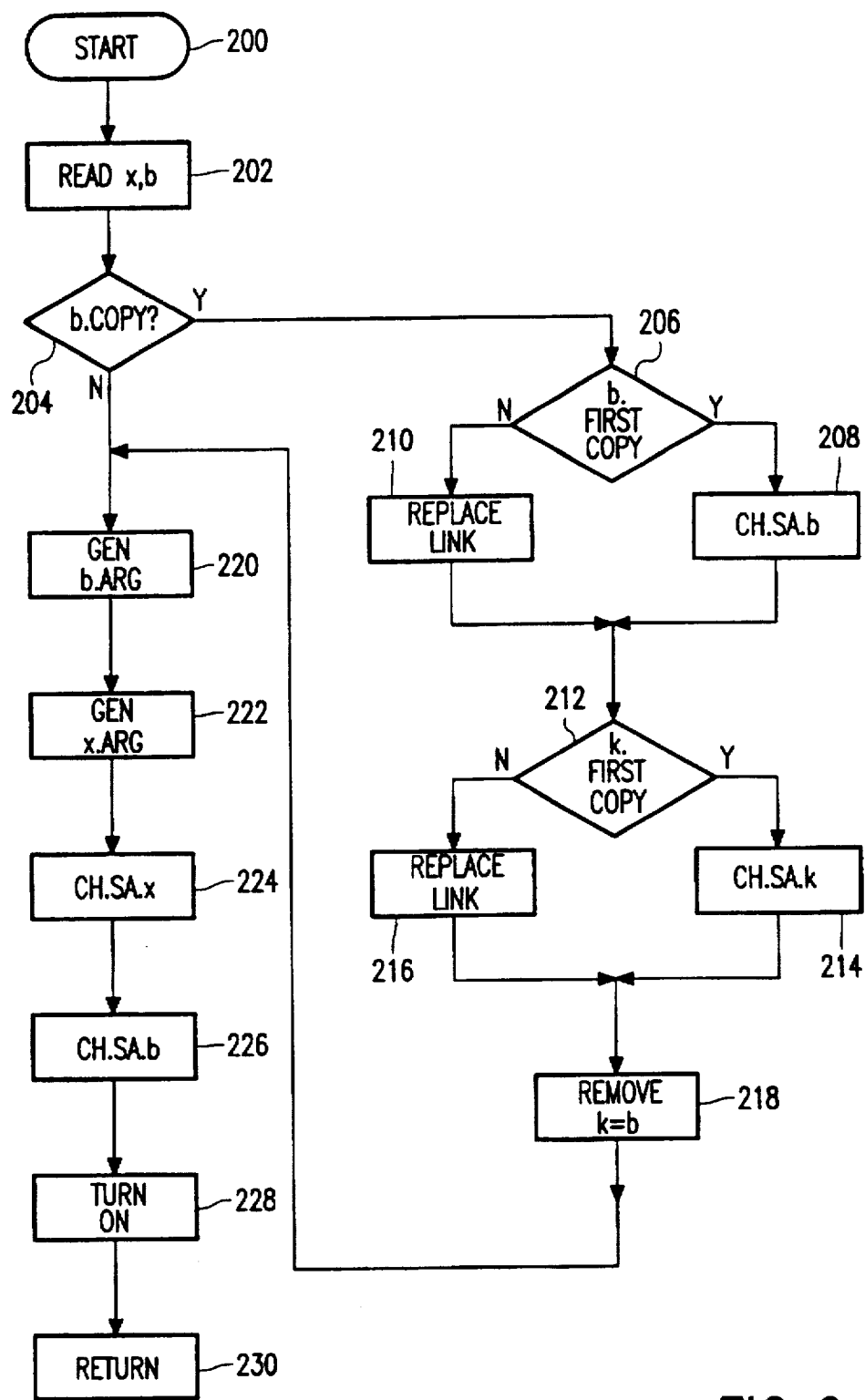
FIG. 9 is a flow chart illustrating the steps carried out by the processor of FIG. 5 to execute an identify instruction.

The remaining, earlier, steps 202 to 218 of the flow chart of FIG. 9 are executed to provide mutual exclusion, that is to avoid the output state of the second element being linked to the output state of more than one other element which could cause difficulties. Thus the identify instruction checks at 204 whether the propagate function of the second elements (b) specified in the identify instruction has a copy instruction already. If so, both that copy instruction (in the PF for b) and the corresponding one in the propagate function of the element (k) to which that element (b) is linked are disabled by resetting the start addresses SA of those elements to indicate their original propagate functions at steps 208 and 214. The disabled copy instructions could be erased or overwritten in memory, if desired. As a second element may itself be copied by more than one further element, checks are made at 206 and 212 to see whether the copy instruction affected is the first or a subsequent one for each element and, where it is not the first copy, it is replaced by a link from the preceding copy to the next copy or start address as appropriate.

Figure 10:
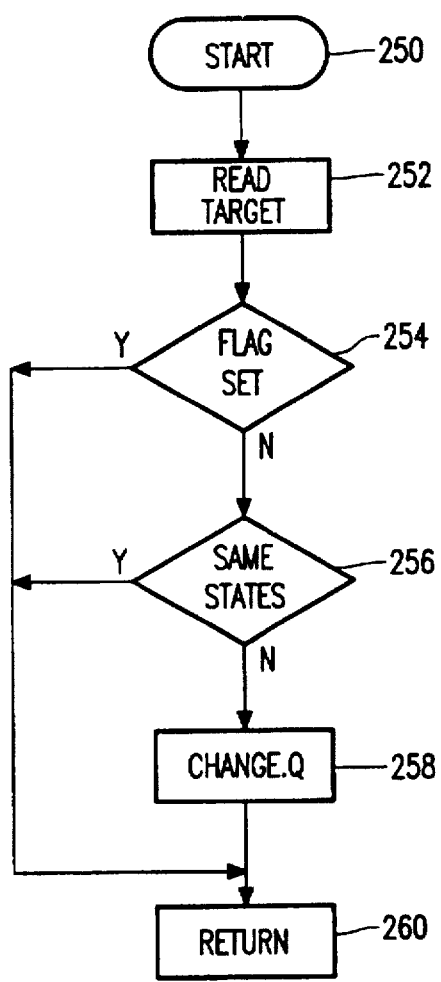
FIG. 10 is a flow chart illustrating the steps carried out by the processor of FIG. 5 to execute a copy instruction.

The copy instruction is shown in the flow chart of FIG. 10 in which the steps have the following functions:

250—Start

252—read target element and return address from copy argument

254—is the queued flag of the target element set?

256—are the states of the host element and the target element the same?

258—place change of state of target element in event queue and set queued flag of target element 260—Return to specified return address.

The copy instruction quite simply alters the output state of the target element to correspond with the output state of the originating or host element whenever the propagate function of the host element is executed, in other words whenever the output state of the host element changes. To avoid potential clashes with changes of output state of the target element which are already queued the copy instruction is arranged at 254 to be subjugated to already queued changes of output state of the target device. As an alternative to this "weak" copy, a "strong" copy may be provided which is arranged to effect the change of output state of the target element regardless and then remove the already queued state change from the event queue. Care needs to be taken with a "strong" copy if the output state of the host element changes rapidly, with one possible safeguard being to allow for only the latest state change to be queued.

Figure 11:
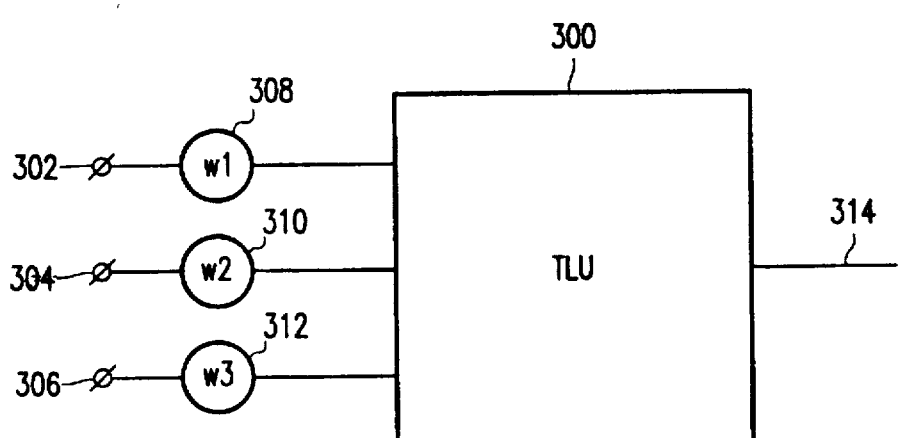
FIG. 11 shows a threshold logic unit (TLU).

Apparatus embodying the invention may be arranged to operate with further element types for example a threshold logic unit (TLU). A TLU 300 is shown in FIG. 11 and comprises a number of binary inputs 302, 304, 306 connected to respective weighting devices 308, 310, 312. The weighting devices 308, 310, 312 multiply the binary inputs by factors w1, w2 and w3 respectively and the TLU adds the weighted inputs together. If the sum of the weighted inputs is equal to or exceeds a threshold value then an output 314 of the TLU will be turned on and if the sum of the weighted inputs is less than the threshold then the output of the TLU will be turned off.

A TLU instruction in the propagate function of an originating element may have the form:

TLU.300.w where w is the weight which is applied to the binary output of the originating element for application to the TLU 300. The TLU instruction may conveniently be arranged to only add (if the originating element turns on) or subtract (if the originating element turns off) the specified weight to an internal TLU state. If the internal state increases above or falls below the threshold then the output state of the TLU 300 changes and its own propagate function is executed.

The AND_THEN function provides an output state if a first specified input becomes set and then a second specified input becomes set. An internal state bit is used to define the intermediate state in response to the first specified input becoming set which is effected by the previously described AND_THEN_left instruction. If the second specified input becomes set by the previously described AND_THEN_right instruction, and this internal state bit is already set, then the output of the AND_THEN element turns on. If either input turns off, the AND_THEN element output state turns off.

The propagate function for a device may be stored remote from the memory 60 and the SA portion of memory 62 then contains the address of the relevant portion of memory. This is especially useful if the propagate functions are large or duplicated. The probability of two devices having identical propagate functions (and so sharing a single copy) increases with the size of the system. To exploit such duplication, the propagate function may be arranged to specify target elements by use of relative addressing.

An apparatus in accordance with the present invention may be arranged to support a number of different systems each having their own event queue and being interconnected using copy and/or identify instructions. In such a case the identify and copy instructions would need to be extended to specify the system in which the target device is located. Such different systems could be implemented on different machines to provide multiprocessing. The identify and copy instructions would then also need to specify the machine in which the target device is located.

From reading the present disclosure, other modifications will be apparent to persons skilled in the art. Such modifications may involve other features which already known in the field of data processing apparatuses and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A data processing apparatus comprising:

means for modelling a first asynchronous logic circuit as a plurality of circuit elements having functions governed by a set of rules, each defining a response to a given conditions;

means for responding to any condition being satisfied by generating an associated response, such that two or more of the elements function as registers, each element having two or more output states; and means for generating a further rule applied to at least one of the register elements, the associated response to the further rule being a change of an output state of said at least one register element in response to a change of an output state of a further register element identified by the further rule.

2. Apparatus as claimed in claim 1, wherein a change of state of an element due to a copy rule is not effected where an earlier change of state instruction, other than due to the copy rule, exists but has still to be implemented.

3. Apparatus as claimed in claim 1, wherein, where an earlier change of state instruction exists for a further element, which change of state instruction has yet to be implemented when a change of state instruction arising from a copy rule is generated, the instruction due to the copy rule is implemented and the earlier instruction cancelled.

4. Apparatus as claimed in claim 1, comprising means for applying a second further rule to a pair of the register elements, according to which rule copy rules are applied to each element of the pair in respect of changes of output state of the other.

5. Apparatus as claimed in claim 1, wherein the pair of register elements are nominated as first and second elements and, on initial application of an identify rule, the output state of the second element is set to change to correspond to that of the first element.

6. Apparatus as claimed in claim 5, wherein respective identify rules may be applied to pairs formed by a single first element and respective ones of a plurality of second elements.

7. Apparatus as claimed in claim 5, wherein the application of a further identify rule to an element nominated as a second element in a first identify rule cancels said first identify rule where said second element is so nominated in said further identify rule.

8. Apparatus as claimed in claim 4, in which the means for applying an identify rule comprises a further modelled register element, wherein when the output state of the control register element has a first value the identify rule is applied, and when it has a second value, the copy rules between the two register elements are cancelled.

9. Apparatus as claimed in claim 1, comprising means for modelling a plurality of further asynchronous logic circuits, including a working memory area in which the first and further circuits are modelled, and data storage means from which data defining yet further asynchronous logic circuits may be called into the working memory area.

10. Apparatus as claimed in claim 9, comprising means for applying a second further rule to a pair of register elements, according to which rule copy rules are applied to each element of the pair in respect of changes of output state of the other, and wherein one or more identify rules are applied to register element pairs formed by register elements from separate ones of the asynchronous logic circuits modelled in the working memory area.

* * * * *